United States Patent [19]

Luscher

[11] 4,295,056
[45] Oct. 13, 1981

[54] INTEGRATED FREQUENCY DIVIDER
[75] Inventor: Jacob Luscher, Venthone, Switzerland
[73] Assignee: Ebauches S.A., Switzerland
[21] Appl. No.: 54,230
[22] Filed: Jul. 2, 1979
[51] Int. Cl.³ .................... H03K 21/00; H03K 5/13
[52] U.S. Cl. ........................ 307/221 C; 307/223 C; 307/225 C; 307/269
[58] Field of Search ............ 307/221 E, 223 C, 269, 307/225 C

[56] References Cited
U.S. PATENT DOCUMENTS

| | | | |
|---|---|---|---|
| 3,801,826 | 4/1974 | Gorski | 307/221 C |
| 3,922,567 | 11/1975 | Adam et al. | 307/223 C |
| 3,946,225 | 3/1976 | Stein | 307/223 C |
| 4,193,037 | 3/1980 | Kyu | 307/225 C |
| 4,214,174 | 7/1980 | Dickson | 307/221 C |

Primary Examiner—Harold A. Dixon
Attorney, Agent, or Firm—Allegretti, Newitt, Witcoff & McAndrews

[57] ABSTRACT

The frequency divider allows division of the frequency of two signals in phase opposition $\phi_1(t)$ and $\phi_2(t)$. A shift register 10 comprises an assembly of transistors and capacitors which form a plurality of cells connected one after the other, each cell being comprised of two identical stages which are connected in series and are supplied respectively by the periodic signals. Means for detecting particular stages of the register comprise the MOS transistors $T_8$, $T_9$, and $T_{10}$. Means for producing a signal with a frequency which is a sub-multiple of that of the said periodic signals comprise the transistors $T_{11}$ and $T_{12}$, the transistor $T_{13}$, the capacitor $C_7$ and the capacitor $C_9$. The divider is especially suitable for use in quartz oscillator watches.

10 Claims, 21 Drawing Figures

INTEGRATED FREQUENCY DIVIDER

BACKGROUND OF THE INVENTION

The present invention relates to an integrated frequency divider of very low consumption. Such a circuit has a particularly advantageous application in a small-size portable device, powered by a battery which is required to have a running life of several years. As is known, the energy consumption problem is particularly acute when the frequency to be divided is high, as is the case, for example, in high chronometric performance quarts oscillator watches, in which the frequency of the oscillator can be as much as a few MHz.

Attempts have been made to reduce energy consumption in frequency dividers by using C-MOS integrated binary circuits. Currently, most quartz oscillator watches are equipped with such circuits. In this instance, consumption is essentially determined by the charging and discharging of capacitors presented by each stage of the shift register with the periodicity of its output signal. The consumption of each stage is consequently proportional to the value of its capacitors and to the frequency of its output signal. In a high frequency quartz oscillator watch, then, it is the first stages, that is to say, those that divide the highest frequencies, which are determinative of the power consumption of the electronics. In order to lower the capacitances of these stages, various manufacturing techniques have been used, such as those known by the name of Si-gate or SOS, (Silicon on sapphire). However, to keep power consumption within acceptable limits, the dimensions of the integrated circuits have to be reduced to such a point that, in the modern state of the art, the cost of their manufacture becomes prohibitive.

To lower consumption, high frequency dividers with a large part of their capacitors forming part of a resonant circuit have also been proposed. A system of this type, for example, is described in Swiss Pat. No. 558,111. In this instance, the energy periodically stored in the capacitors is recovered. The system makes use of a shift register of a known type realized in integrated form and designated an IGFET (insulated Gate FET) bucket brigate register. This register is ring connected and a single charge packet is transferred from one cell to the other. Each cell comprises firstly two IGFET's in series and two capacitors connected between the respective transistor control electrodes and drains. The control electrodes are connected alternately to two lines supplied by a push-pull quartz oscillator supplying two alternating voltages in phase opposition. Means are additionally provided to bias the crystalline substrate in which the circuits are integrated. Devices, placed at various places in the register, form voltage pulses on passage of the charge. Another device is controlled by these latter pulses to supply a voltage whose frequency is a sub-multiple of the oscillator frequency and which is intended to control a relatively low frequency divider.

The assembly of the cells of the register described above presents a low capacitive load to the oscillator and the reactive current due to this capacitance causes a very small loss in the quartz. The principal real power which has to be supplied by the oscillator is that dissipated in the transistor through which the charge transfer from one stage to the other is effected. The mode of functioning of the register (a detailed description of which will be found in the article of C. N. Berglund et al, "Fabrication and Peformance Considerations of Charge-Transfer Dynamic Shift Registers", Bell Sys. Techn. Journal, Vol. 51, No. 3, March 1972) is such that the current passes through the transistor for about ¼ period and that the source-drain voltage of the latter during this time passes practically from the value $V_p$ to 0, $V_p$ being the peak-to-peak value of the phase supply voltage supplied by the oscillator. Consequently, the power supplied by the oscillator, expressed by the general relation $$P_t = \frac{2}{T} \int_0^{\frac{T}{2}} i_D(t) \cdot v_{SD}(t) \cdot dt,$$

in which $i_D(t)$ and $v_{SD}(t)$ are the instantaneous values, respectively, of the drain current and the source-drain voltage of the transistor, T being the oscillation period, then becomes:

$$P_T = (V_p + v_m)^2 \cdot c \cdot f.$$

In this expression, C is the capacitance associated with the transistor, f is the oscillator frequency, and $v_m$ represents the mean control voltage which exceeds the transistor threshold voltage. The voltage $v_m$ is normally a few tenths of a volt, while $V_p$ is a few volts.

Taking a typical example with the values $V_p = 2V$, $v_m = 0.3$ v, $C = 0.1$ pF and $f = 4.2$ MHz, a value of 2.2 $\mu$W is obtained for $P_T$.

Consequently, it is because of the high voltage necessary for the transfer of the charge packet from one cell of the register to the other that the power supplied by the oscillator is relatively high.

BRIEF SUMMARY OF THE INVENTION

The principal object of the present invention is to provide a frequency divider with a very low power consumption, allowing, for example, the realization of a high frequency wrist watch with a battery life of several years.

According to the present invention, there is provided a frequency divider circuit for two periodic signals in phase opposition comprising, integrated in a semi-conductor substrate, a first shift register comprising a plurality of transistors and capacitors which form a plurality of cells connected one after the other, each cell being constituted by two identical stages which are connected in series and are supplied, in use, by the two periodic signals respectively, first detection means for detecting a particular state of the register, and first production means, responsive to the detecting of said state to produce a first signal with a frequency which is a sub-multiple of that of the said periodic signals, and wherein each stage of the shift register comprises an MOS transistor structure which has two principal electrodes respectively forming the input and output of the stage and two control electrodes, one of which is, in operation, connected to a bias source and the other of which is connected to the output principal electrode, and a capacitor, one plate of which is connected to said output electrode and the other plate of which receives one of said periodic signals.

The detection means can comprise a plurality of MOS transistors connected in series, these transistors being equal in number to that of the register cells and having their control electrodes respectively connected to the output electrodes of the cells (which are the output electrodes of the second stage of each cell). Because of this arrangement, the transistors in series are simultaneously on for the duration of one period of the periodic signals to be scaled, and this is reproduced with a periodicity equal to (n+1) times the period of these signals, n being the number of register cells. It is in response to this turning on of the transistors in coincidence that an output signal is produced with a frequency which is a sub-multiple of that of the signals in phase opposition.

The production means which allow production of this signal, comprises two MOS transistors mounted in series with the detection means transistors and with their control electrodes respectively connected to receive the periodic signals to be scaled, a third MOS transistor whose control electrode is connected to the connection of the detection means transistors with the two aforesaid transistors, a first additional capacitor in series with the third transistor and connected to receive one of the periodic signals, and a second additional capacitor connected to the connection of the two aforesaid transistors. Through this arrangement, the turning on of the transistors of the detection means in coincidence causes the appearance, on the connection between the third transistor and the first additional capacitor, of an output signal whose frequency is that of the periodic signals divided by (n+1). This output signal is also transmitted to the control electrode of the first stage of the shift register to enable the introduction of a new charge packet in the latter.

According to another advantageous embodiment of the invention, two divider circuits similar to that described above can be coupled to form a circuit with a division factor equal to 2(n+1), n being the number of cells in each shift register. In this instance, the output signals of the dividers alternately put into one or other of the stable stages of a bistable circuit, whose outputs apply respective control signals to the detection circuits of the two dividers.

As may be more fully described below, the frequency divider according to the invention has a very low power consumption which makes it particularly well adapted to dividing high frequency signals.

BRIEF DESCRIPTION OF THE DRAWINGS

The invention will be described in more detail, by way of illustrative examples, with reference to the accompanying drawings, in which.

DETAILED DESCRIPTION OF THE PREFERRED EMBODIMENTS

Figure 1:
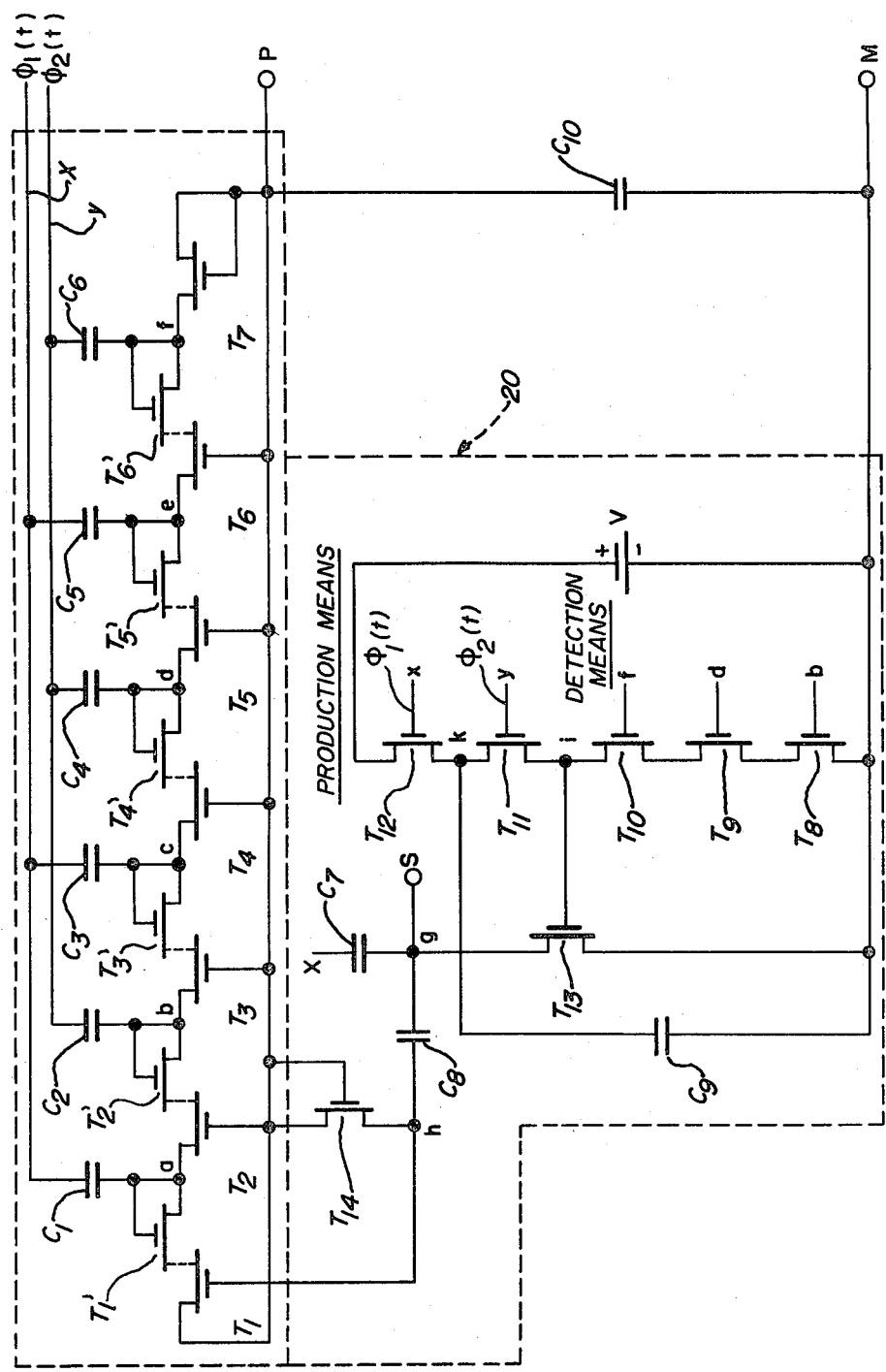
FIG. 1 represents a first embodiment of a frequency divider according to the invention.

In FIG. 1, at 10, there has been represented diagrammatically the equivalent circuit of an illustrative embodiment of an integrated shift register with three cells of the type which is described in the copending patent application filed by the Applicant for "Integrated Shift Register" on the same date as this application and to which reference will be made for a detailed description.

The first cell of the register 10 comprises the double transistor MOS structure $T_1-T'_1$ and the capacitor $C_1$ for the first stage, and the double transistor MOS structure $T_2-T'_2$ and the capacitor $C_2$ for the second stage. In the same way, the capacitors $C_3$ and $C_4$ and the double transistor MOS structures $T_3-T'_3$ and $T_4-T'_4$ form the second cell of the register, while the capacitors $C_5$ and $C_6$ and the double transistor MOS structures $T_5-T'_5$ and $T_6$ and $T'_6$ constitute its third cell. In this series of cells connected one after the other, one cell is comprised of two identical stages, connected in series, each stage having an MOS transistor structure which has two principal electrodes respectively forming the input (that of the transistors $T_2$, for example) and the output (that of the transistor $T'_2$, for example) of the stage, and two control electrodes, one of which (that of the transistor $T_2$, for example) is connected to a bias source and the other of which (that of the transistor $T'_2$, for example) is connected to the output principal electrode (that of the same transistor $T'_2$). Each stage also comprises a capacitor, one plate of which is connected to this output principal electrode and the other of which is intended to receive one or other of the two supply signals coming respectively through the lines X (for example, for $C_1$) and Y (for example, for $C_2$). At the ends of the series of cells, the control electrode of the transistor $T_1$ of the first stage is intended to receive the pulse through which a charge packet is introduced into the register, and the charge comes from the latter via transistor $T_7$ connected to the output of the last cell and with its control electrode connected to its drain.

The system is controlled by a push-pull oscillator (not here illustrated) such as that described, for example, in Swiss Pat. No. 580,837, which supplies on the lines X and Y two sinusoidal voltages in phase opposition, $\phi_1(t)$ and $\phi_2(t)$, respectively. The divider represented in FIG. 1 functions to scale the frequency of these periodic signals. Additionally, by means of a voltage multiplier (not here illustrated) such as, for example, that described in Swiss Pat. No. 553,481, the oscillator biases the crystalline substrate of the assembly negatively in relation to a reference ground M. Similarly, a line P is negatively biased in relation to M. The source of the input transistor $T_1$ and the control electrodes of the transistors $T_2$ to $T_7$ of the register 10 are connected to this line which constitutes the bias source.

Analysis shows, when expressed in the same terms as those used previously for a shift register of the "IGFET bucket brigade" type, that the power to be supplied by the oscillator for the transfer of the charge packed is then: $P_T = 1.8 \cdot V_p \cdot V_m \cdot c \cdot f$.

Assuming the same sorts of value as previously, a power of 0.45 $\mu w$ is obtained. This power was 2.2 $\mu w$ with the "IGFET bucket brigade" register. It is consequently clear that the register used in the present invention allows the power which has to be supplied by the oscillator to be considerably reduced. Additionally, as is evident from the copending patent application identified above, the voltage established on each of the contacts a—b—c—d—e—f— when the charge contained in the register passes through the MOS structure to which the contact concerned belongs, and then through the subsequent structure (for example, the structures $T-T'_1$ and $T_2-T'_2$ for the contact a), is considerably smaller than the voltage established when no transfer occurs. It is precisely this feature of the register 10 which is advantageously used in the present invention for the realization of a frequency divider circuit with very low consumption.

Figure 2:
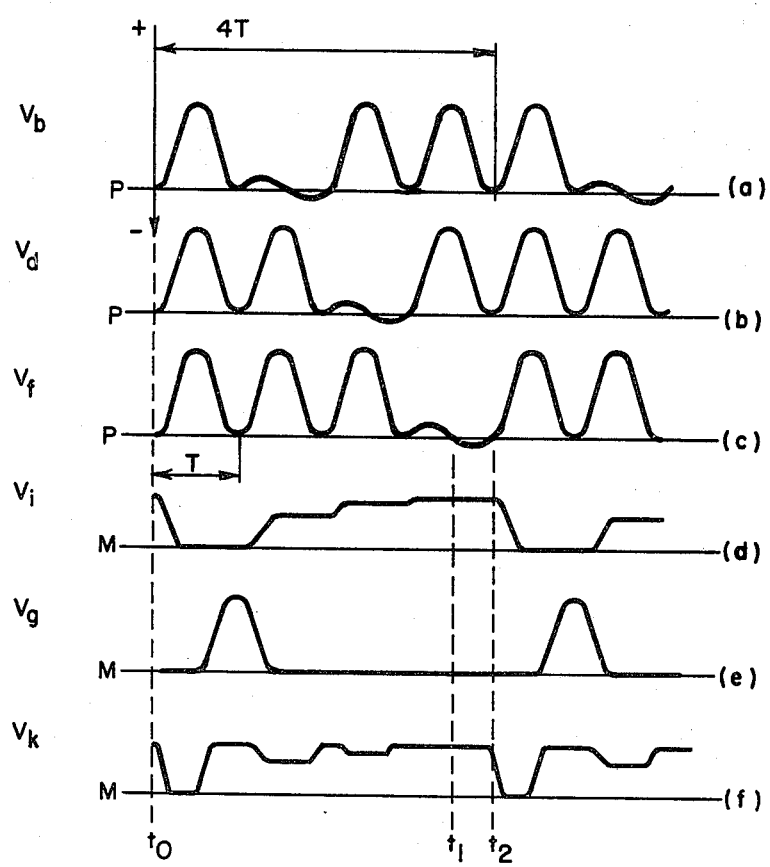
FIG. 2 is a diagram serving to explain the functioning of the divider in FIG. 1.

Reference is made to the diagrams in FIGS. 2a, 2b and 2c, which represent the variation as a function of time of the voltages $v_b$, $v_d$ and $v_f$ established at the output of each cell at the points b, d and f respectively, when a charge packet shifts in the register. These diagram figures show that, from the instant $t_o$ the signals $v_b$, $v_d$ and $v_f$ have, in coincidence, one high value for the duration of one period T of the oscillator and that the coincidence is repeated with a period equal to 4T. Reference again is made to FIG. 1 to describe the circuits 20 connected to the register 10, which have the task of detecting this coincidence of high values for the voltages at the outputs b, d and f of the cells and of producing, in response, an output signal with a frequency which is a sub-multiple of that of the signals in phase opposition applied by the oscillator to the lines X and Y.

In the circuits 20 in FIG. 1, the detection of the coincidence is effected by three MOS transistors $T_8$, $T_9$ and $T_{10}$, while the production of the output signal is ensured by three MOS transistors $T_{11}$, $T_{12}$, and $T_{13}$ and by two capacitors $C_7$ and $C_9$. The five MOS transistors $T_8$ to $T_{12}$ are mounted in series at the terminals of a supply voltage source, battery V. The control electrodes of the transistors $T_8$, $T_9$ and $T_{10}$ are respectively connected to the register outputs b, d and f, while the control electrodes of the transistors $T_{11}$ and $T_{12}$ are respectively connected to the lines Y and X. The point i common to the transistors $T_{10}$ and $T_{11}$ is connected to the control electrode of the transistor $T_{13}$, connected between the reference ground M and a point g, while the capacitor $C_9$ is connected between M and the point k common to the transistors $T_{11}$ and $T_{12}$. The point g is connected, on the one hand to the line X by the capacitor $C_7$ and, on the other hand, to the control electrode of the transistor $T_1$, by a capacitor $C_8$. A last MOS transistor $T_{14}$ with its control electrode connected to the line P, is connected between the latter and a point h located between the capacitor $C_9$ and the transistor $T_1$. Finally, a decoupling capacitor $C_{10}$ connects the line P to the reference ground M.

The functioning of the frequency divider illustrated in FIG. 1 can be described in the following way. First, it must be indicated that since the transistors $T_{11}$ and $T_{12}$ are controlled by the two voltages in phase oppositions $\phi_1(t)$ and $\phi_2(t)$ respectively, one or other of these transistors is blocked at each instant. Consequently, when the input capacitor of the transistor $T_{13}$, as will appear later, is discharged by the transistors $T_8$, $T_9$ and $T_{10}$ which are, because of the indirect connection between their control electrodes and the line Y, controlled by a voltage derived from the phase voltage $\phi_2(t)$, the recharging of this capacitor is afterwards delayed by one period of the phase voltage $\phi_1(t)$. Since at this moment, the voltage $v_i$ at the point i (FIG. 2d) is at such a level that the transistor $T_{13}$ is blocked, a voltage pulse $v_g$ appears at the point g (FIG. 2e). To return now to the three transistors $T_8$, $T_9$ and $T_{10}$ in series, a comparison of FIGS 2a, 2b and 2c shows that these transistors are turned on in coincidence by the signals $v_b$, $v_d$ and $v_f$ for the duration of a period T of the oscillator and that this is reproduced with a period of 4T. The current which passes through the three transistors in coincidence causes the discharging of the input capacitor of the transistor $T_{13}$, as well as that of the capacitor $C_9$. As previously indicated, the appearance of a pulse $v_g$ at the point g (FIG. 2e) results from this.

It will be noted in passing that the particularly novel structure of the register 10 gives rise to an important property of this type of register, namely, the disposing of relatively high signals and of a duration of one period at the time of coincidence. This is what allows the discharging of a relatively large capacitance by a current which has to pass through several transistors in series.

The pulse $v_g$ appearing at the point g is transmitted by the capacitor $C_8$ to the control electrode of the first MOS structure of the shift register, the transistor $T_{14}$ having the task of defining the potential of this control electrode. Consequently, it is through this that a new charge packet is introduced into the register to leave again through the transistor $T_7$ between the instants $t_1$ and $t_2$ (FIG. 2f).

It should be noted that the register 10 has to be biased negatively in relation to the reference ground M so that the transistors $T_8$, $T_9$ and $T_{10}$ stay entirely blocked during the time when there is no coincidence of the signals $v_b$, $v_d$ and $v_f$ at their high value. The value of this bias, applied on the line P, and derived according to the teaching of Swiss Pat. No. 553,481 already cited, must be greater than half of the control voltage of a double transistor MOS structure, necessary for the transfer of a charge packet. For example, in this illustrative embodiment, this bias is of the order of 2 to 3 tenths of a volt.

Thus it is clear, by reference to FIGS. 2d, 2e and 2f, that the divider according to the invention allows the signals $v_i$, $v_g$ and $v_k$, whose periodicity is 4T, to be obtained on the points i, g and k. There is thus realized, with a register with three cells, a division of the oscillator frequency by four. More generally, it will be apparent to those skilled in the art, that with a shift register with n cells, a divider with a division factor of n+1 is obtained.

The signal obtained at the point g and available on an output terminal S is very suited to, for example, the control of a binary divider, like that described in Swiss Pat. No. 592,331, which contains transistors of the same type and capacitors. The divider according to the invention thus can form, with a chain of binary dividers according to Swiss Pat. No. 592,331, an integrated assembly on one single substrate. As a result of the use of the divider according to the invention, the power consumption of the assembly is very greatly reduced for the highest frequencies.

Figure 3:
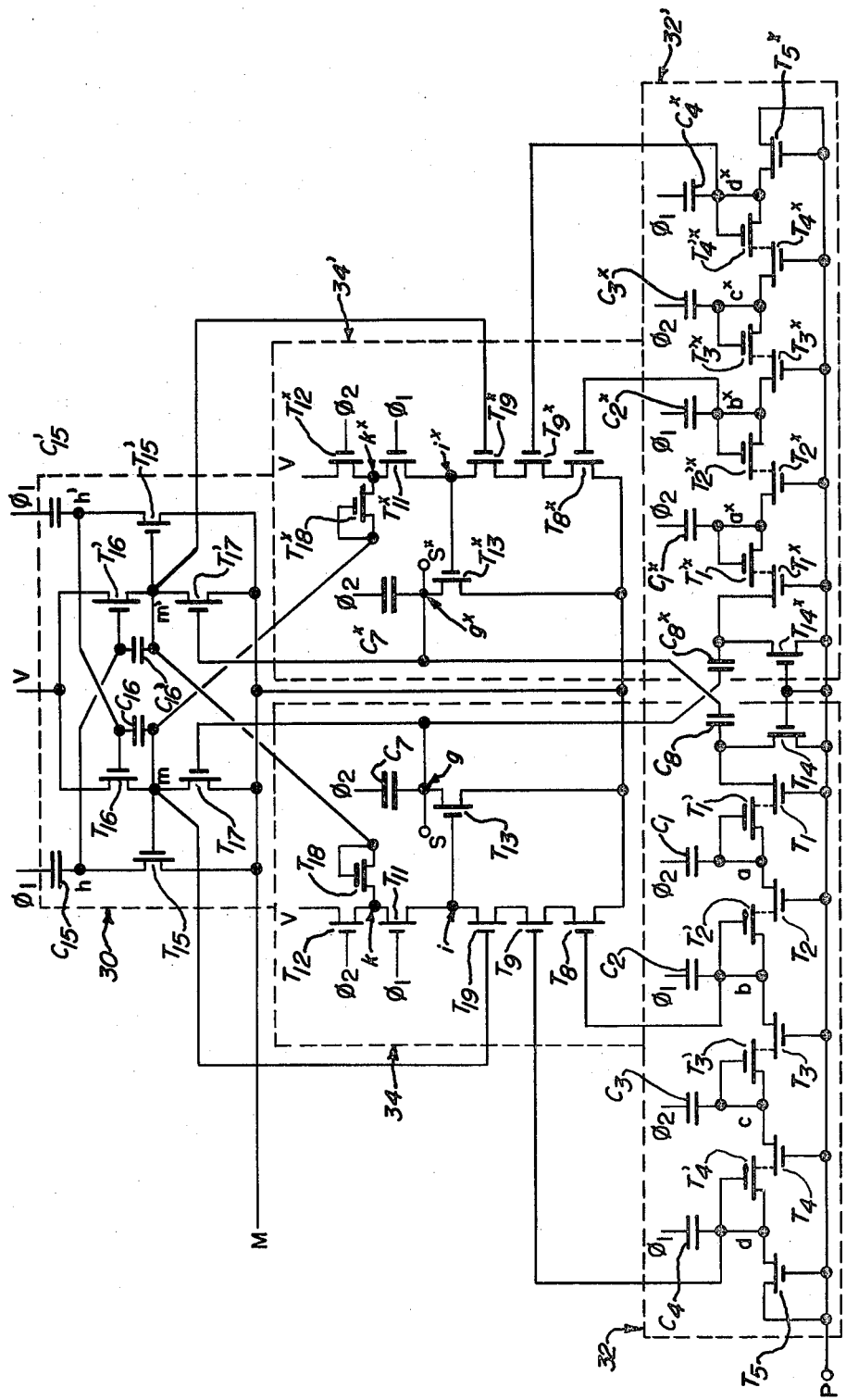
FIG. 3 represents another embodiment of a divider with duplicate structure according to the invention.

The particular type of shift register used in the present invention allows the realization of a large variety of frequency dividers. Reference will now be made to FIG. 3 in which another advantageous embodiment of a frequency divider according to the invention has been illustrated, this time using two shift registers of the above type. Such a divider is particularly suitable for controlling a C-MOS divider of lower frequency and conventional type. Such a divider is particularly suitable for controlling a C-MOS divider of lower frequency and conventional type. In this instance, the push-pull oscillator supplying the two voltages in phase opposition and the frequency divider form a unit which can, for example, be integrated in a p region independent of the p regions used for the N-MOS transistors of the divider with complementary transistors.

It should also be noted that, to obtain a highly desirable functioning of the circuit 20 in FIG. 1, the number of transistors in series having their control electrodes respectively connected to the outputs of the shift register links need be no more than five or six. This means that the register need have only five or six cells which allows a maximum division factor of six or seven. The illustrative double divider represented in FIG. 3 represents a useful solution for easily obtaining a division factor equal to twelve or fourteen.

In the double divider represented in FIG. 3, a bistable circuit 30 is set alternately in one or other of its stable states by two dividers similar to that in FIG. 1, the first being formed by the shift register 32 and the circuits 34, and the other by the register 32' and the circuits 34'.

The bistable circuit 30, of known type, is controlled by the voltage $\phi_1(t)$ and connected to a supply source (not illustrated) which supplies the voltage V, the line M constituting the system's reference ground. The two stages of the bistable 30 are formed by the MOS transistors $T'_{15}$, $T'_{16}$ and $T'_{17}$ and the capacitors $C_{15}$ and $C_{16}$, and the other by the transistors $T'_{15}$, $T'_{16}$, and $T'_{17}$ and the capacitors $C'_{15}$ and $C'_{16}$.

The shift registers 32 and 32' and the associated circuits 34 and 34' comprise elements which occur again in the register 10 and its circuit 20 in FIG. 1. Consequently, in FIG. 3, these elements have been designated by the same reference numerals and letters as in FIG. 1 as far as the divider 32-34 is concerned, the references of the divider elements 32'-34' bearing the sign$^x$. It will be noted that, for simplicity, the registers 32 and 32' comprise only two cells whose outputs are connected to the transistors $T_8$ and $T_9$ of the circuit 34 and to the transistors $T^x_8$ and $T^x_9$ of the circuit 34' respectively. It is, however, evident to those skilled in the art that the number of cells can be considerably larger.

The divider in FIG. 3 differs from that in FIG. 1 in that the circuits 34 and 34', mounted in series with the transistors $T_8$-$T_9$ and $T^x_8$-$T^x_9$ respectively, comprise two additional MOS transistors $T_{19}$ and $T^x_{19}$ respectively, with their control electrodes respectively connected to the points m and m' of the bistable 30, which constitute the two outputs of the latter.

Another, but not essential difference, as will appear later, consists in the presence of two transistors $T_{18}$ and $T^x_{18}$ connected respectively between the points k and m' and the points $k^x$ and m. The two transistors also have their control electrodes connected to the points m' and m respectively.

In addition, the point g of the circuit 34 is connected to the capacitor $C^x_8$ of the circuit 32' (and no longer to the capacitor $C_8$ of its circuit 32) and to the control electrode of the transistor $T_{17}$ of the bistable circuit 30. Similarly, the point $g^x$ of the circuit 34' is connected to the capacitor $C_8$ of the circuit 32 and to the control electrode of the transistor $T'_{17}$ of the bistable circuit. The control electrodes of the transistors $T_{17}$ and $T'_{17}$ will be considered to be the control inputs of the bistable circuit 30.

The functioning of the frequency divider in FIG. 3 will now be described with reference also to the explanatory diagrams in FIG. 4. It will initially be assumed that the input capacitance of the transistor $T_{15}$ is charged. There is consequently practically no alternating voltage relative to M at the point h of the bistable circuit 30. As the transistor $T'_{15}$ is blocked, an alternating voltage superposed on a direct voltage with the value of its amplitude is disposed at the point h'. In this instance, the transistor $T_{19}$ is turned on by the control signal it receives from the output m of the bistable circuit while the transistor $T^x_{19}$ is blocked. Consequently, the capacitance of the transistor $T_{13}$ is discharged and a voltage pulse $v_g$ appears on the drain of this transistor, according to the technique already described, when the signals $v_b$ and $v_d$ coming from the register have, in coincidence, high value. This pulse is transmitted by the capacitor $C^x_8$ to the control electrode of the first MOS structure of the register 32'. Consequently, a new charge packet is introduced into this register. As the transistor $T_{17}$ is also controlled by this pulse, the input capacitance of the transistor $T_{15}$ of the bistable circuit 30 is discharged by the current passing through $T_{17}$. The bistable circuit then switches into its other state, for which there is a voltage relative to M at the point m', but no voltage at the point m. Because no charge packet is introduced into the shift register 32 at that instant, the output signals of the latter stay in coincidence. This is allowable because the transistor $T_{19}$ is now blocked. The transistor $T^x_{19}$ is now turned on by the control signal it receives from the output m' of the bistable circuit. Because of the charge packet then passing through the register 32', the transistors $T^x_8$ and $T^x_9$ are blocked one after the other. The coincidence of the turning on of these two transistors occurs only on expulsion of this charge packet, afterwards causing the appearance of a voltage pulse $v^x_g$ at the drain of the transistor $T^x_{13}$. This output pulse of the circuit 34' makes the bistable circuit switch back into its first stable stage for which there is a voltage present at the point m, while a charge packet is introduced into the shift register 32, and so forth.

As previously indicated, the transistors $T_{18}$ and $T^x_{18}$ are not essential for ensuring the functioning of the frequency divider according to the invention. These transistors allow the value of the capacitance of the storage capacitor $C_9$ (see FIG. 1) to be reduced. In fact, as is evident in the diagram in FIG. 4, the initial recharging of the input capacitance of the transistor $T_{13}$ or $T^x_{13}$ is in this case made not by a partial discharging of the storage capacitor but by a current which passes through the transistor $T_{18}$ or $T^x_{18}$ at this moment. Thus, in practice it is only the input capacitance of the transistor $T_{13}$ or $T^x_{13}$ which has to be recharged with the periodicity of the divided signal of the oscillator. By using the transistors $T_{18}$ and $T^x_{18}$ with a very low stage capacitance, only the transistors $T_{11}$-$T_{12}$ and $T^x_{11}$-$T^x_{12}$ serve to ensure the starting of the divider when it is latched.

Figure 4:
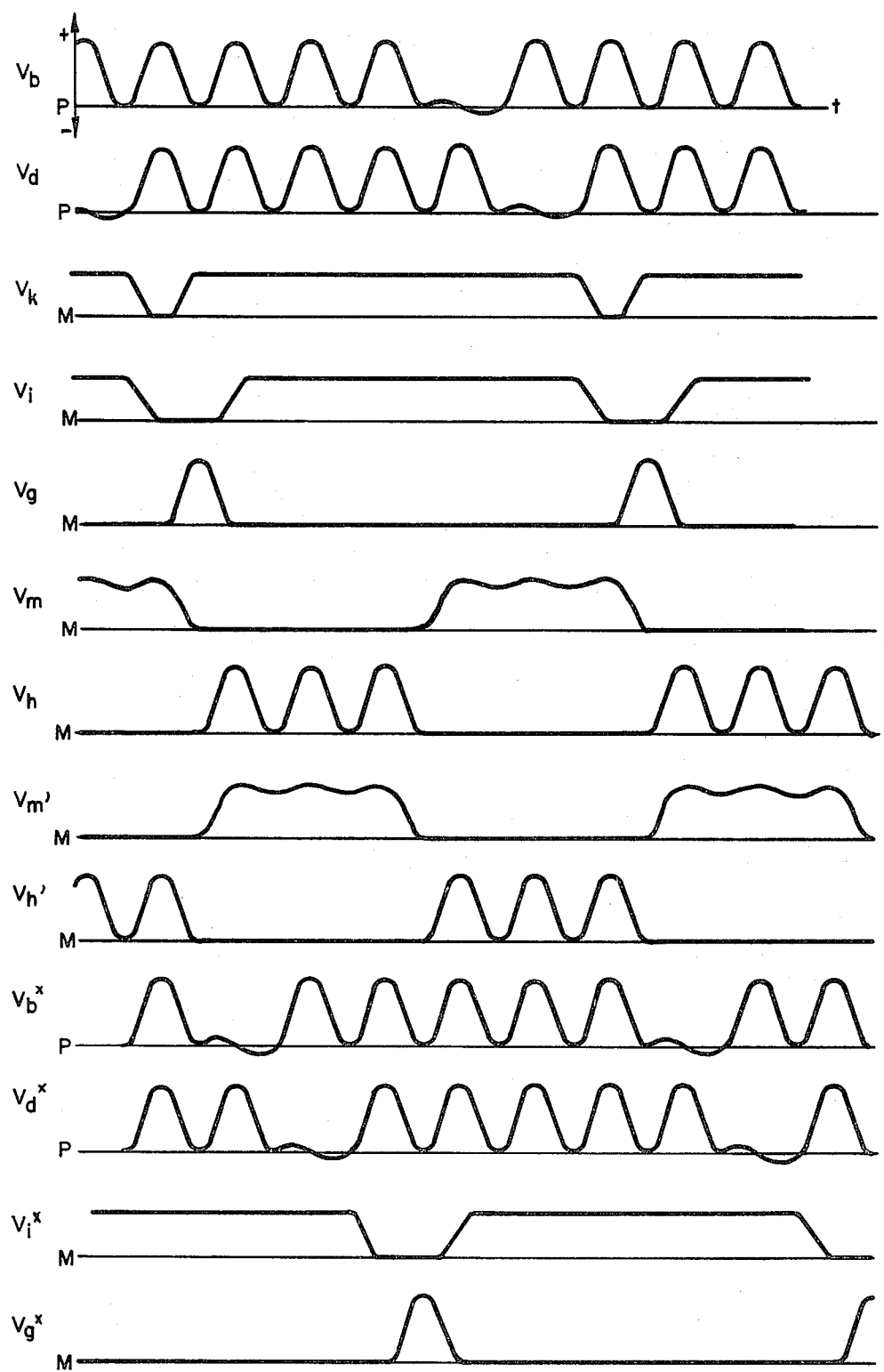
FIG. 4 is a diagram serving to explain the functioning of the divider embodiment shown in FIG. 3.

FIG. 4 shows very clearly that the output signals obtained at the points g and $g^x$, respectively available at the output terminals S and $S^x$, have a period of 6T, which consequently corresponds to a division factor equal to six. To generalize, the division factor obtained by the double divider is equal to 2 (n+1), n being the number of cells in each shift register. If, for example, one cell were added to each of these registers, whose output would control an additional transistor in series with the transistors $T_8$-$T_9$ and $T^x_8$-$T^x_9$ respectively, the division factor would become equal to eight.

It should be mentioned that the four configurations formed respectively by the transistor $T_{13}$ with the capacitor $C_7$, the transistor $T^x_{13}$ with the capacitor $C^x_7$, the transistor $T_{15}$ with the capacitor $C_{15}$ and the transistor $T'_{15}$ with the capacitor $C'_{15}$ can be regarded as dynamic inverters. For a detailed description of the functioning of these dynamic inverters, reference can be made to the article of J. Luscher et al, "1966 International Solid State Circuits Conference, Digest of Technical Papers", pp. 116-117.

As in the integrated system described in Swiss Pat. No. 558,111 identified above, the frequency divider which has just been described can advantageously form a unit with the push-pull oscillator supplying the phase voltages $\phi_1(t)$ $\phi_2(t)$.

The load presented to the oscillator by the frequency divider has a real component and a reactive component, the latter being provided by the capacitance $C_D$ which the divider presents to the oscillator. The reactive current which passes through this capacitance causes a certain dissipation of power $P_Q$ in the quartz crystal of the oscillator. This power is about $$P_Q \sim 2(\cdot V_P \cdot \Pi \cdot f)^2 \, C_o \cdot C_D \cdot R_s$$

with $C_o$=capacitance parallel to the quarts due to its static capacitance and to that of the properly so-called oscillator circuit, $R_S$=series resistance of the quartz.

The power which has to be supplied by the oscillator owing to the real component of its load is, firstly, the power $P_T$ necessary to ensure the transfer of the charge packet into the shift registers and, additionally, the Power $P_I$ dissipated in the four dynamic inverters $T_{13}$–$C_7$, $T^x{}_{13}$–$C^x{}_7$, $T_{15}$–$C_{15}$ and $T'{}_{15}$–$C'{}_{15}$ when the transistor of these is turned on. The equation allowing the determination of $P_T$ has been set forth above. As for the power $P_I$, this can be determined in the following way.

The resistance presented by a transistor which is on is far lower than the reactance presented by the capacitor C in series with this. The alternating current which passes through it is consequently practically sinusoidal, its amplitude being:

$$i = V_p \, 1 \, 2 \, 2 \, \pi f \, C.$$

For the resistance $R_o$ of a transistor which is on, those threshold voltage is practically O, the calculation:

$$R_o = \frac{1}{2K \, V_e}$$

can be carried out with k=slope of the transistor in A/V$^2$, $V_e$=input direct voltage.

It follows that the power dissipated in the transistor of an inverter when it is on can be expressed by the equation:

$$P = \frac{(V_p \, \pi f \, C)^2}{4k \, V_e}$$

Supposing the aforesaid four dynamic inverters to be of the same dimensions and to have the same control voltage (in their on state) and taking into account that each inverter transistor of the bistable circuit ($T_{15}$ and $T'{}_{15}$) is on for a half-period per period of the output signal of the divider, the total power $p_I$ dissipated in these transistors becomes about:

$$P_I = \frac{(V_p \, \pi f \, C)^2}{k \, V_e}$$

With an efficiency $\eta$ of the circuit maintaining the oscillator (see Swiss Pat. No. 580,837 above cited) and a battery voltage V, for the consumption $i_A$, due to losses caused by the alternating currents at the frequency of the oscillator supplying the divider, the following expression is obtained:

$$i_A = \frac{P_Q + P_T + P_I}{\eta \, V}$$

To this consumption is added the consumption $i_D$ which is directly supplied by the battery, that is to say, the current necessary for the recharging of the capacitances associated with the points i, $i^x$, m and m' with the periodicity of the output signal of the divider, as mentioned above. In the present instance, these capacitances are in practice charged to the same voltage $V_e$ which is, typically, of the order of IV. This consumption then becomes:

$$i_D = C_e \, V_e \frac{f}{2(n+1)}$$

in which $C_e$ represents the whole of the capacitances associated with the points i, $i^x$ and m, m'.

To divide a frequency of 4.2 MHz, for example, while assuming an oscillator whose output voltage peak-to-peak per phase is 2V, adequate values for a divider of this type are:

$C_{15} = C'{}_{15} = C_7 = C'{}_7 = 0.1$ pF.

A same value can be provided for all the shift register capacitors. The slope k of the transistors $T_{15}$, $T'{}_{15}$, $T_{13}$, $T^x{}_{13}$, can then be of the order of $2 \cdot 10^{-5}$ A/V$^2$. Such a value for k is obtained, for example, for example, for an n type transistor, whose effective channel length is 8 μm and its width about 10 μm.

A value of about 50 ohms can be assumed as series resistance for a quartz crystal of this frequency. An oscillator of the type described, whose capacitance $C_o$ does not exceed pF is entirely feasible. With the values of the capacitors described for the divider, the capacitance presented by their per phase becomes about 0.8 pF, that is to say that the capacitance $C_D$ parallel to the quartz crystal due to the divider is 0.4 pF. Consequently, an approximate value 0.08 μW is obtained for $P_Q$. With an input voltage V of the dynamic inverter transistors equal to IV, an approximate value of 0.26 μW is obtained for $P_I$. About 0.6 μW must be taken into account for the power $P_T$ due to the charge packet transfer. Finally, the current for maintaining the oscillator can easily be dimensioned so that its efficiency may be 0.8. Consequently, a value of about 0.8 μA can be obtained for $i_A$, with a battery voltage of 1.5 V. Under the conditions mentioned, the capacitance $C_e$ becomes about 0.4pF, that is to say, the current $i_D$ becomes equal to 0.2 μA for a division factor of eight, for example. In the present example, the consumption of the oscillator alone being 0.4 μA, that of the oscillator-divider unit is about 1.4 μA.

This low power consumption is achieved with an integrated circuit of relatively large dimensions, which facilitates its manufacture. It is however evident that with more advanced miniaturization, the power consumption of this divider can become extremely low.

The signals obtained at the points h, h' or m, m' are very well suited to the control of a C-MOS divider. If control is required of a circuit with relatively high input capacitance, an inverter (not illustrated) similar to those defined above can also be connected at each of the points a, c, $a^x$ and $c^x$. These additional inverters must then be supplied by the phase voltage $\phi_2(t)$. Thus, when the charge packet is, for example, introduced into the capacitance associated with the point a, then transferred to the capacitance associated with the point b, a signal appears at the inverter output in question, and this signal is similar to those obtained at the points g and $g^x$. Since a single charge packet passes through the shift register during the duration of a period of the divider output signal, a signal shifted in the time in relation to the others is obtained at each output of the four inverters. The signals are, then, very suitable for controlling a decoupling circuit of the type described, for example, in Swiss Pat. No. 572,666.

While the invention has been illustrated and described as comprising one or more preferred embodiments, it is not intended to be limited to the details shown, since various modifications and changes may be made by those skilled in the art without departing from the spirit of the invention as disclosed and claimed herein.

What is claimed is:

1. A frequency divider circuit for two periodic signals in phase opposition comprising, integrated in a semi-conductor substrate, a first shift register comprising a plurality of transistors and capacitors which form a plurality of cells connected one after the other, each cell being constituted by two identical stages which are connected in series and are supplied, in use, by the two periodic signals respectively, first detection means for detecting a particular state of the register, and first production means, responsive to the detecting of the said state to produce a first signal with a frequency which is a sub-multiple of that of the said periodic signals, and wherein each stage of the shift register comprises an MOS transistor structure which has two principal electrodes respectively forming the input and output of the stage and two control electrodes, one of which is, in operation, connected to a bias source and the other of which is connected to the output principal electrode, and a capacitor, one plate of which is connected to the said output electrode and the other plate of which receives one of the said periodic signals.

2. A divider circuit according to claim 1, wherein the detection means detect the presence in coincidence of signals of given amplitude at a pre-determined point in each of the cells of the said register.

3. A divider circuit according to claim 2, wherein the detection means comprise a plurality of MOS transistors connected in series, these transistors being equal in number to that of the shift register cells and having their control electrodes respectively connected to the output electrodes of the cells.

4. A divider circuit according to claim 3, wherein the said means for producing a signal with a frequency which is a sub-multiple of that of the said periodic signals comprise a pair of MOS transistors mounted in series with the transistors of the detection means and having their control electrodes respectively connected to receive the said periodic signals, a third MOS transistor whose control electrode is connected to the connection of the transistors of the detection means with the said pair of transistors, a first additional capacitor in series with the third transistor and connected to receive one of the said periodic signals, and a second additional capacitor connected to the connection of the two transistors of the said pair.

5. A divider circuit according to claim 4, wherein the connection of the first additional capacitor with the third transistor is coupled to the first control electrode of the first cell of the shift register.

6. A divider circuit according to claim 1, further comprising a second shift register substantially identical to the said first register, second detection means for detecting a particular stage of the second shift register, second production means, responding to the detecting of the said state, for producing a second signal with a frequency which is a sub-multiple of that of the said periodic signals, and a bistable circuit having a first and second control input and a first and second output, the said first and second control inputs being connected to receive the said first and second signals respectively and the said first and second outputs being connected to supply control signals to the first and second detection means respectively.

7. A divider circuit according to claim 6, wherein the first and second detection means are substantially identical and each comprises a plurality of MOS transistors connected in series, these transistors being equal to number to that of the cells of the corresponding shift register and having their control electrodes respectively connected to the output electrodes of the cells of this register, and an MOS transistor connected in series with the said plurality of transistors and whose control electrode is connected to receive one of the control signals produced by the bistable circuit.

8. A divider circuit according to claim 7, wherein the first and second production means are substantially identical and each comprises a pair of MOS transistors mounted in series with the transistors of the corresponding detection means and having their control electrodes respectively connected to receive the said periodic signals, a third MOS transistor whose control electrode is connected to the connection of the transistors of the detection means with the said pair of transistors, and a capacitor in series with the said third transistor and connected to receive one of the said periodic signals, the output of the said production means being formed by the connection of this capacitor to the third transistor.

9. A divider circuit according to claim 8, wherein the first production means further comprise an MOS transistor connected between the second output of the bistable circuit and the connection of the two transistors of the pair of the said first production means; and the second production means further comprise an MOS transistor connected between the first output of the bistable circuit and the connection of the two transistors of the pair of the said second production means.

10. A divider circuit according to claim 8, wherein the output of the first production means is coupled to the first control electrode of the first cell of the second shift register, and the output of the second production means is coupled to the first control electrode of the first cell of the first shift register.

* * * * *